United States Patent
Yang

(10) Patent No.: US 6,518,797 B2
(45) Date of Patent: Feb. 11, 2003

(54) CURRENT MODE LOGIC CIRCUIT WITH OUTPUT COMMON MODE VOLTAGE AND IMPEDANCE CONTROL

(75) Inventor: Jungwook Yang, West Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/753,268

(22) Filed: Dec. 29, 2000

(65) Prior Publication Data

US 2003/0006804 A1 Jan. 9, 2003

(51) Int. Cl.[7] ..................... H03K 19/086; H03K 19/02
(52) U.S. Cl. ..................... 326/127; 326/57; 327/54; 327/56
(58) Field of Search ................. 326/31–34, 66, 326/67, 73, 74, 83, 84, 115, 127, 56, 57, 58; 327/52, 54, 56

(56) References Cited

U.S. PATENT DOCUMENTS

| | | | | |
|---|---|---|---|---|
| 3,590,274 A | * | 6/1971 | Marley | 307/215 |
| 4,904,953 A | | 2/1990 | McCormack | |
| 5,495,184 A | * | 2/1996 | Des Rosiers et al. | 326/73 |
| 5,774,013 A | * | 6/1998 | Groe | 327/543 |
| 6,025,742 A | * | 2/2000 | Chan | 327/108 |
| 6,054,874 A | * | 4/2000 | Sculley et al. | 326/83 |

* cited by examiner

*Primary Examiner*—Daniel Chang
(74) *Attorney, Agent, or Firm*—Ference & Associates

(57) ABSTRACT

In a current mode logic (CML) circuit, a high impedance state is implemented at the output for a bi-directional buffer. The output common mode voltage can be adjusted at the same time, which is particularly useful for a CML off-chip driver.

12 Claims, 3 Drawing Sheets

US 6,518,797 B2

CURRENT MODE LOGIC CIRCUIT WITH OUTPUT COMMON MODE VOLTAGE AND IMPEDANCE CONTROL

FIELD OF THE INVENTION

The present invention relates generally to current mode logic (CML) circuits.

BACKGROUND OF THE INVENTION

CML (current mode logic) is widely used for high-speed bipolar logic circuitry because of its low power consumption and relatively low supply voltage compared to emitter coupled logic (ECL). CML also tends to provide a good-quality output signal to the outside of a chip in view of its stable electrical output transfer function.

In this vein, it should be noted that CML and ECL circuits generally represent some of the fastest logic circuits presently in existence as they are composed of bipolar transistors, which have higher transconductance (or, essentially, higher driving capability, so as to drive the circuit load easily and fast). However, CML and ECL logic circuits require static power consumption, meaning that they always draw current from the available power in order to retain to the desired logic function, such that these circuits usually consume high power. Also, bipolar transistors tend to require a significant amount of area. Accordingly, CML and ECL circuits overall are recognized as being high-power circuits that occupy a large amount of area.

CML and ECL circuits, since they are significantly faster than CMOS logic, find use as output drivers in high-speed circuits. However, when CML's are used for output drivers, the output signal levels generally have to be adjusted to communicate with the receiver. Also, in many instances, the common mode of the output must go into a high-impedance state for "testability" features of the circuit. In this vein, it is recognized that the level integration of such circuits is very high, but the number of input and output terminals of the circuit that one can normally probe is limited to only a few hundreds at most. Since circuits generally need to be verified in some manner, they are often verified through the limited number of input and output terminals; otherwise it may not be know which chips do or do not actually function properly. To adequately test the circuit overall, however, including components thereof that are internal and thus cannot be directly probed, the circuit has to be configured for testability. For example, one may apply a unknown sequence or a set of signals to the I/O pins, operate the circuit, then read the results. At that point, the functionality of the entire circuit can be statistically verified. In order to accomplish this, however, an output driver may have to be bi-directional so that it can take an external signal and pass it to the internal circuit. For this reason, the output driver may need to go into a high-impedance state so that it can operate as a receiver.

A need has been recognized in connection with adequately attending to both of these requirements.

SUMMARY OF THE INVENTION

In accordance with at least one presently preferred embodiment of the present invention, a high impedance state is implemented at the CML output for a bi-directional buffer. The output common mode voltage can be adjusted at the same time, which is particularly useful for a CML off-chip driver.

Accordingly, as a consequence of adopting the arrangements contemplated herein, high impedance output is attained with the current mode logic (CML) circuit along with control of the output common mode voltage. This is of particular use to CML-type output driver circuits to achieving a required output common mode voltage.

In one aspect, the present invention provides an arrangement for stabilizing the output common mode voltage of an output stage.

For a better understanding of the present invention, together with other and further features and advantages thereof, reference is made to the following description, taken in conjunction with the accompanying drawings, and the scope of the invention will be pointed out in the appended claims.

DESCRIPTION OF THE PREFERRED EMBODIMENTS

Figure 1:
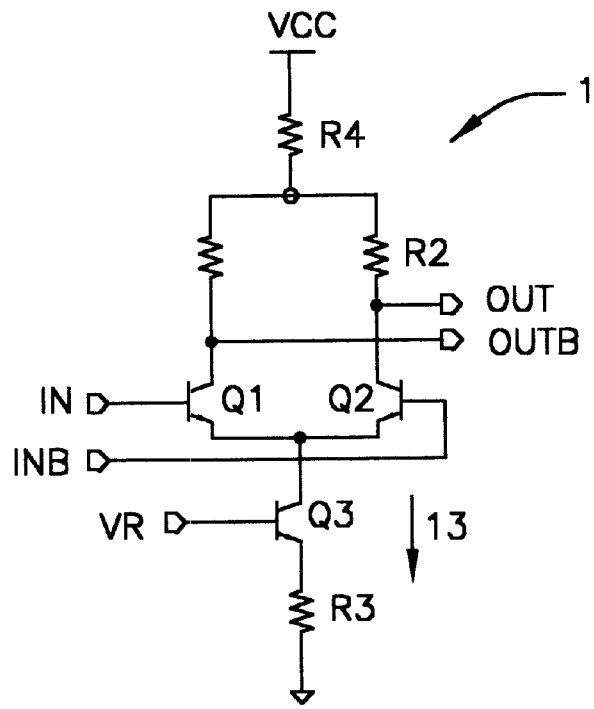
FIG. 1 illustrates a conventional differential CML circuit.

Throughout the drawings, items marked with "Q" are bipolar transistors, "M"—nMOS and pMOS transistors, "R"—resistances associated with various resistors, "I"—currents and "V"—voltages. The meaning of other abbreviations used in the drawings will become apparent from the discussion below.

FIG. 1 illustrates a conventional differential CML circuit with an output common mode voltage (defined as (Vout+ Voutb)/2) adjusted through R4, which is determined by the bias current I3 in Q3 times R4 (more precisely, VCC-I3× (R4+RC/2), where RC=R1=R2). Once R4 is chosen in the circuit, the common mode voltage can only be adjusted by changing I3, which will also change the output differential voltage. Also, this circuit cannot have a high impedance state at the output, which is necessary for bi-directional buffers.

Figure 2:
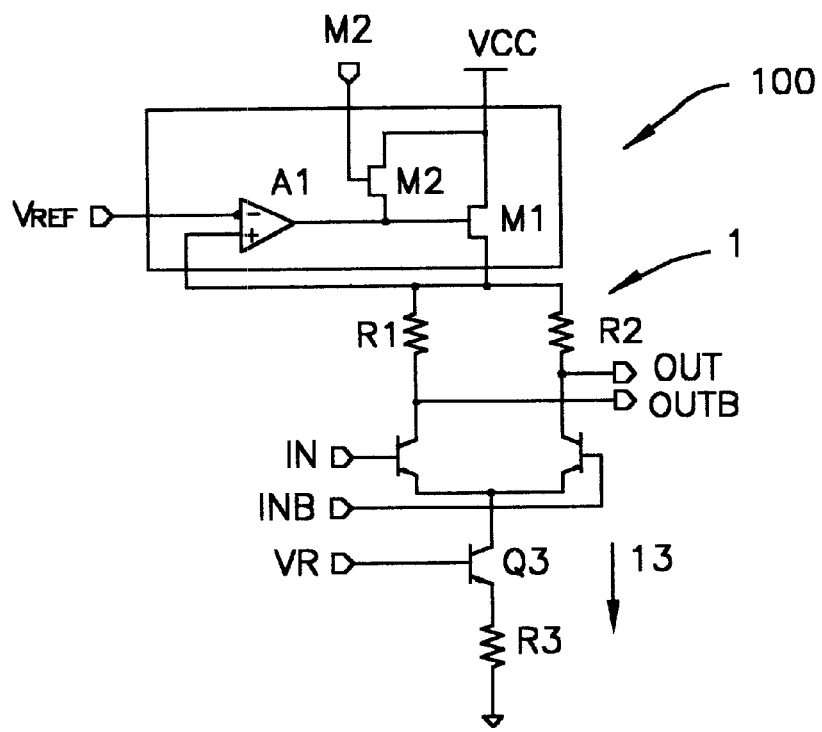
FIG. 2 illustrates a CML circuit in accordance with an embodiment of the present invention.

FIG. 2 illustrates an arrangement contemplated in accordance with a preferred embodiment of the present invention. Here, circuit 100 is configured for adjusting the output common mode voltage of the CML output driver. The resistor at R4 in FIG. 1, which determines the common mode voltage, is now replaced with a pMOS transistor MI. M2 is a transistor to turn the output in the high-impedance (off) state. Vref is the same as the voltage that is expected (or desired) for the output common mode voltage at node 1 in FIG. 1.

A high impedance state at the output may preferably be obtained by turning M2 on, which will turn off M1 by applying VDD (supply voltage for CMOS transistor circuit) at the gate of M1. At the same time, Q3 needs to be turned off by applying 0V at VR input to disable the current path of Q1 and Q2 completely.

In normal operation, transistor M2 needs to be turned off by applying VDD at the HIZ (high impedance state) input. The common mode voltage is set by the feedback using amplifier A1. The voltage at node 1 is sensed at the positive input of A1. This feedback using A1 and M1 generates the gate voltage of M1 such that the voltage at node 1 is the same as Vref, which is applied from outside of the circuit to set the common mode voltage. Typically, Vref can be generated using reference voltage generator circuit such as supply-independent bias circuit or bandgap reference.

In this case, the common mode output voltage at the output is set at $$Vref-Rc \times I3/2,$$

where Rc=R1=R2 and 13 is the collector current through Q3.

Figure 3:
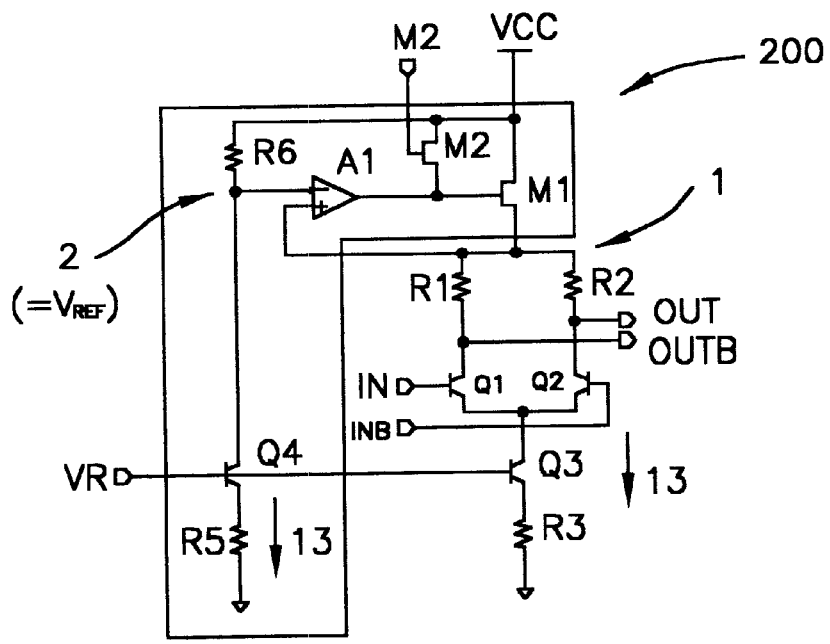
FIG. 3 illustrates a circuit arrangement for generating a voltage Vref.

Vref can be generated by a circuit 200 as shown in FIG. 3. Resistance R6 and current 14 (through Q4) in FIG. 3 are preferably chosen such that the voltage at 2 can be m the same as Vref in FIG. 2. R6 and 14 can be scaled without changing the voltage at 2 by keeping the product of the two (14×R6) to be the same to reduce the power consumption. For example, the power consumption in the reference generation circuit composed of R5, R6 and Q4 can be reduced to half by reducing 14 in Q4 by half and by doubling the resistance R6.

Figure 4:
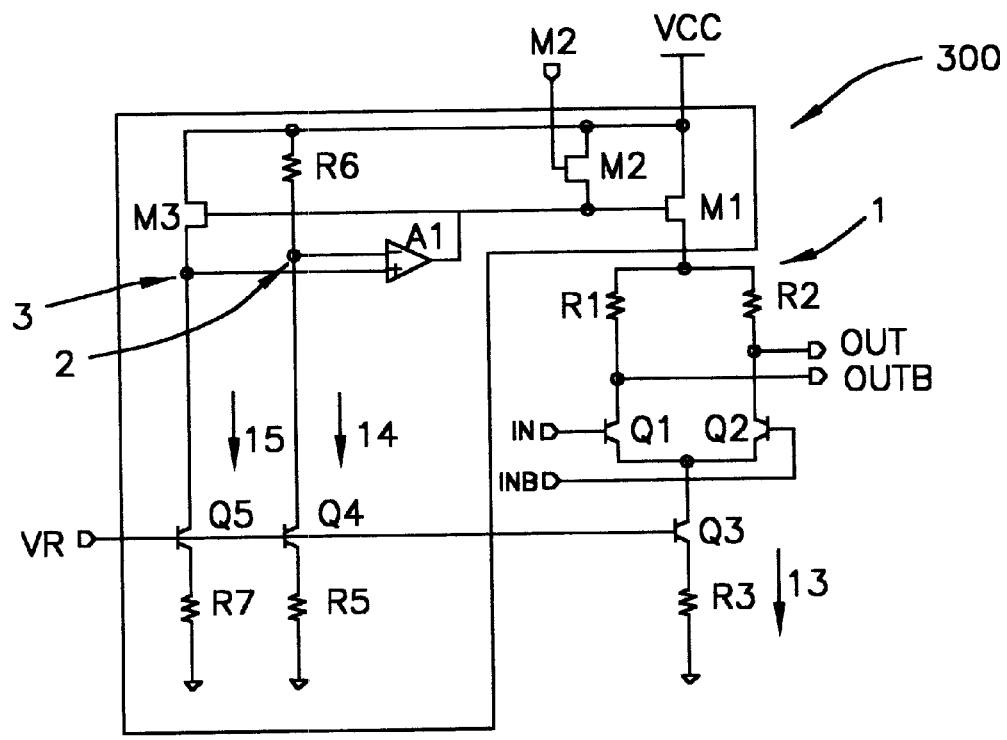
FIG. 4 illustrates a circuit arrangement which provides a reduced-noise node in comparison with the circuit arrangement of FIG. 3.

The node 1 in FIG. 3 is noisy because it is connected to the output node OUT and OUTB, which toggle continuously as the input switches. Thus, as an alternative, instead of connecting sensing node 1 directly to A1, the arrangement in FIG. 4 may be adopted, where M1 can be replicated to M3 with the current source transistor Q5, whose current level is the same as that in Q3. In this configuration, the voltage at node 1 and node 3 are the same as long as M1 and M3 are close to each other. Hence, sensing the voltage at node 3 is the same as sensing node 1 as in FIG. 4.

Here, the W/L ratio (width/length ratio, which determines the transconductance of the transistor) of M3 and the bias current 15 through Q5 can be scaled such that the voltage drop at M3 is constant. For example, the current level in Q5 can be made 1/n of that in Q3, and then the W/L ratio of M3 is made n times as small (W/nL) as that of M1 (W/L). By doing this, the power consumption can be reduced by a factor of n. In the same way, the current in Q4 can be made 1/n if the resistance of R6 is n times as large as before, as explained earlier.

M1, M2, and M3 do not have to necessarily be MOS transistors, but can be embodied by essentially any suitable device, such as a bipolar transistor, MeSFET, or the like, that controls conductance with a control input. (Since MesFETs are not integrated with bipolar transistors in one technology, a desirable combination may well be either MOS-bipolar transistors in BiCMOS [bipolar and CMOS] technology, or bipolar transistors only in bipolar technology). Also, the circuits described, illustrated and contemplated herein do not have to be restricted to those applied only to bipolar CML output stages, but could also include those applied to essentially any differential stages, such as MOS output stages and MeSFET output stages.

Figure 5:
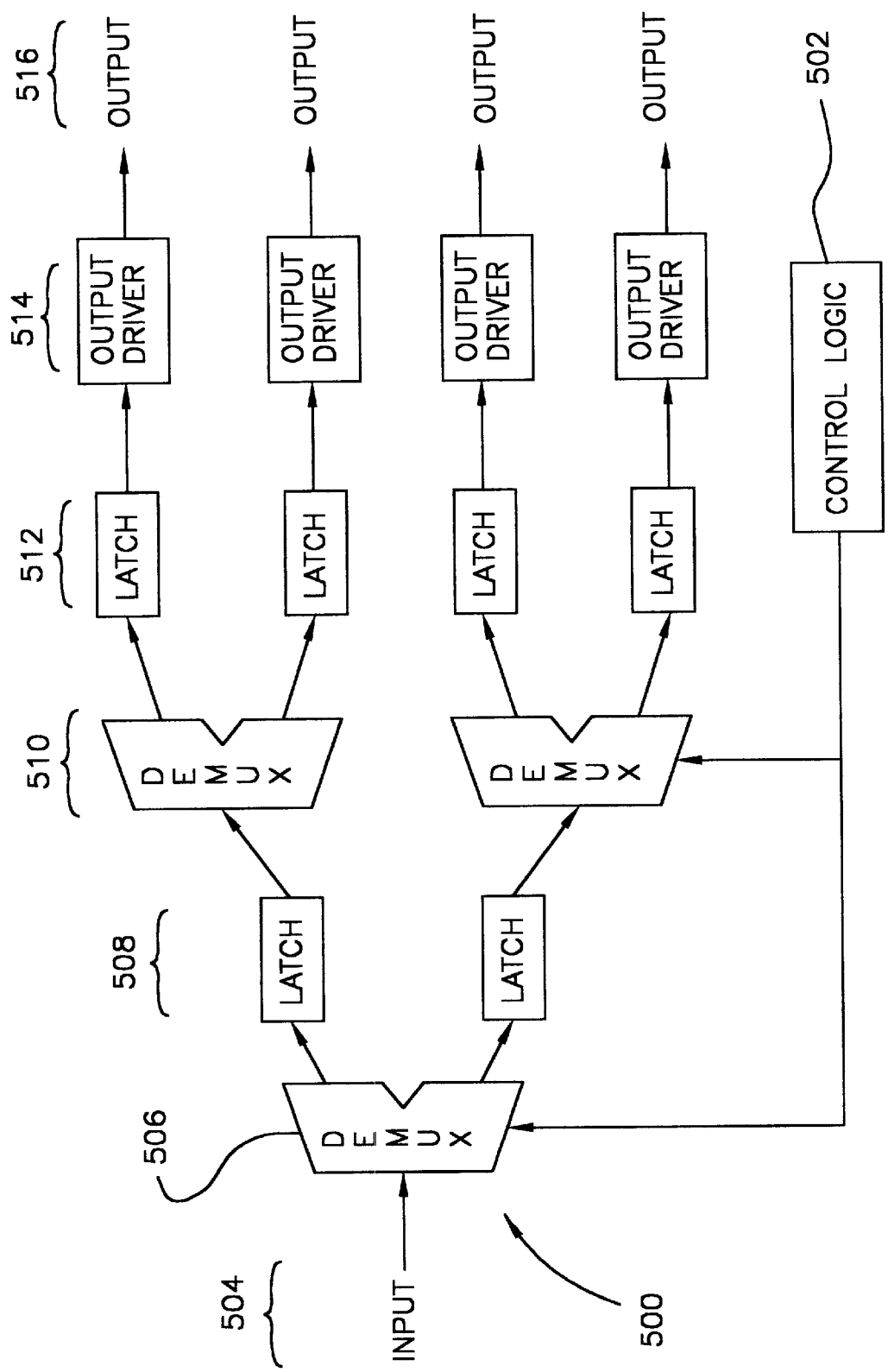
FIG. 5 schematically illustrates a demultiplexing circuit in which a CML circuit according to at least one embodiment of the present invention may be employed.

FIG. 5 schematically illustrates a demultiplexing circuit 500 in which a CML circuit 502 according to at least one embodiment of the present invention may be employed. Shown, particularly, is a 1-to-4 demultiplexer circuit, for converting a high-speed serial inputs to low-speed parallel outputs. As shown, there may be a high-speed serial input 504 into a demultiplexer 506, the output of which proceeds to two latches 508 and then to two additional demultiplexers 510. The output of demultiplexers 510, in turn, proceeds to four latches 512 and thence four output drivers 514 that provide the final four outputs 516. Control logic inherent in a CML circuit 502 in accordance with at least one embodiment of the present invention could, for example, be adapted to control the demultiplexers 506 and 510, as shown.

If not otherwise stated herein, it is to be assumed that all patents, patent applications, patent publications and other publications (including web-based publications) mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A circuit comprising:
   an arrangement for stabilizing the output common mode voltage of an output stage;
   wherein said output stage is a CML high impedance output stage;
   said stabilizing arrangement comprising a feedback internal to the circuit;
   said feedback being adapted to set the output common mode voltages
   said stabilizing arrangement further comprising a pair of input ports configured for assisting in the establishment of said CML high impedance output stage.

2. The circuit according to claim 1, wherein:
   said feedback comprises an amplifier and at least one element adapted to provide conductance control.

3. The circuit according to claim 2, wherein said at least one element adapted to provide conductance control comprises at least one MOS transistor.

4. The circuit according to claim 3, wherein said at least one MOS transistor comprises two MOS transistors.

5. The circuit according to claim 4, wherein one of said MOS transistors is adapted to provide a high impedance state at the output stage.

6. The circuit according to claim 5 wherein said one of said MOS transistors is adapted to turn off the other of said MOS transistors in providing a high impedance state at the output stage.

7. The circuit according to claim 2, further comprising a dedicated arrangement for providing a reference voltage at said amplifier, the reference voltage corresponding to the desired output common mode voltage to be set.

8. The circuit according to claim 7, wherein:
   said dedicated arrangement for providing a reference voltage at said amplifier comprises a resistor and a bipolar transistor;
   said resistor and bipolar transistor being adapted to provide a reference voltage that is constant.

9. The circuit according to claim 4, wherein said at least one MOS transistor comprises an additional MOS transistor, said additional MOS transistor being adapted to reduce noise at a reference node.

10. The circuit according to claim 9, further comprising a current source transistor associated with said additional MOS transistor.

11. The circuit according to claim 10, wherein the W/L ratio of said additional MOS transistor and a bias current through said current source transistor are scaled such that the voltage drop at said additional MOS transistor is constant.

12. The circuit according to claim 1, further comprising solely one operational amplifier provided at an input stage of said circuit.

* * * * *